(12) United States Patent
Plat et al.

(10) Patent No.: US 6,423,650 B2
(45) Date of Patent: *Jul. 23, 2002

(54) ULTRA-THIN RESIST COATING QUALITY BY INCREASING SURFACE ROUGHNESS OF THE SUBSTRATE

(75) Inventors: Marina V. Plat, San Jose; Christopher F. Lyons, Fremont; Michael K. Templeton, Atherton; Bhanwar Singh, Morgan Hill, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/371,715

(22) Filed: Aug. 9, 1999

(51) Int. Cl.$^7$ .................. H01L 21/31; H01L 21/469
(52) U.S. Cl. .................. 438/780; 438/665; 438/778; 438/798; 438/964; 438/974; 430/313
(58) Field of Search ................. 438/964, 974, 438/798, 665, 709, 710, 778, 780, 781; 430/327, 318, 317, 313

(56) References Cited

U.S. PATENT DOCUMENTS

| | | | | |
|---|---|---|---|---|
| 4,225,664 A | * | 9/1980 | Moran et al. | 430/306 |
| 4,350,755 A | * | 9/1982 | Wang | 430/264 |
| 4,859,036 A | * | 8/1989 | Yamanaka et al. | 350/336 |
| 5,079,600 A | * | 1/1992 | Schnur et al. | 357/4 |
| 5,091,047 A | * | 2/1992 | Cleeves et al. | 156/643 |
| 5,468,561 A | * | 11/1995 | Cho | 428/421 |
| 5,583,070 A | | 12/1996 | Liao et al. | 438/398 |
| 5,666,189 A | * | 9/1997 | Rostosker et al. | 355/53 |
| 5,702,832 A | | 12/1997 | Iwasaki et al. | 428/611 |
| 5,714,037 A | * | 2/1998 | Puntambekar et al. | 156/643.1 |
| 5,770,500 A | | 6/1998 | Batra et al. | 438/255 |
| 5,807,660 A | * | 9/1998 | Lin et al. | 430/313 |
| 5,831,272 A | * | 11/1998 | Utsumi | 250/492.2 |
| 5,930,634 A | * | 7/1999 | Hause et al. | 438/307 |
| 6,020,269 A | * | 2/2000 | Wang et al. | 438/717 |

FOREIGN PATENT DOCUMENTS

JP          02172216       *   7/1990    .........  H01L/21/027

* cited by examiner

Primary Examiner—Tuan H. Nguyen
Assistant Examiner—Thanhha Pham
(74) Attorney, Agent, or Firm—Renner, Otto, Boisselle & Sklar, LLP

(57) ABSTRACT

In one embodiment, the present invention relates to a method of processing a semiconductor substrate, involving the steps of providing the semiconductor substrate having an upper surface; roughening the upper surface of the semiconductor substrate so that the upper surface of the semiconductor substrate has an $R_{tm}$ of about 10 Å or more; and depositing an ultra-thin photoresist on the upper surface of the semiconductor substrate, the ultra-thin photoresist having a thickness of about 2,000 Å or less.

19 Claims, 1 Drawing Sheet

ULTRA-THIN RESIST COATING QUALITY BY INCREASING SURFACE ROUGHNESS OF THE SUBSTRATE

TECHNICAL FIELD

The present invention generally relates to ultra-thin photoresist coatings that strongly adhere to underlying substrates. In particular, the present invention relates to increasing the surface roughness of an underlying substrate and applying an ultra-thin photoresist coating over the roughened surface.

BACKGROUND ART

As the trend toward smaller and smaller semiconductor device dimensions continues, there is a constant demand to improve the methods of fabricating and processing such devices. For example, improvements in photolithography techniques lead to thinner gates, smaller vias, thinner lines and high density devices among other desirable features. Photolithography techniques can be improved by increasing resolution and increasing critical dimension control. Resolution and critical dimension control are affected by the thickness of a photoresist coating or layer. Therefore, attempts are made to decrease the thickness of photoresist coatings in order to achieve better resolution and critical dimension control.

However, there are limitations associated with making thin photoresist layers. This is because various difficulties are associated with using thin photoresist layers. One difficulty is defect density or the occurrence of pinholes in thin photoresist layers. Another difficulty associated with thin photoresist layers is dewetting. That is, the photoresist layer may pull back from the edge of the wafer or substrate during final spin, dewet around topography (poor step coverage) or lose adhesion in other areas of the wafer. Dewetting thus leads to incomplete or poor pattern formation. Yet another difficulty associated with thin photoresist layers is the inability to provide a uniformly coated substrate. The thinner a photoresist becomes, the ability to uniformly coat a substrate decreases. Photoresists that are not uniformly coated on substrates lead to decreased resolution and loss of critical dimension control.

SUMMARY OF THE INVENTION

The present invention provides ultra-thin photoresist coatings that strongly adhere to underlying substrates due to the surface roughness of an underlying substrate. The present invention thus also provides substrates having ultra-thin photoresists, on the order of 500 Å to 2,000 Å in thickness, that can be patterned with extremely high resolution enabling the production of thinner gates, smaller vias, thinner trenches, thinner lines, smaller devices and high density devices. The present invention also provides ultra-thin photoresist coatings that uniformly coat underlying substrates.

In one embodiment, the present invention relates to a method of processing a semiconductor substrate, involving the steps of providing the semiconductor substrate having an upper surface; roughening the upper surface of the semiconductor substrate so that the upper surface of the semiconductor substrate has an $R_{tm}$ of about 10 Å or more; and depositing an ultra-thin photoresist on the upper surface of the semiconductor substrate, the ultra-thin photoresist having a thickness of about 2,000 Å or less.

In another embodiment, the present invention relates to a method of increasing adhesion between an ultra-thin photoresist and an upper surface of an underlying substrate, involving the steps of contacting a plasma with the upper surface of the underlying substrate so as to roughen the upper surface; and depositing the ultra-thin photoresist on the roughened upper surface of the underlying substrate, wherein the ultra-thin photoresist has a thickness of about 2,000 Å or less.

In yet another embodiment, the present invention relates to a method of increasing adhesion between an ultra-thin photoresist and an upper surface of an underlying substrate, involving the steps of contacting an acid solution with the upper surface of the underlying substrate so as to roughen the upper surface, the roughened upper surface of the underlying substrate has an $R_{tm}$ of about 25 Å or more; and depositing the ultra-thin photoresist on the roughened upper surface of the underlying substrate, wherein the ultra-thin photoresist has a thickness of about 2,000 Å or less.

DISCLOSURE OF INVENTION

Figure 1:
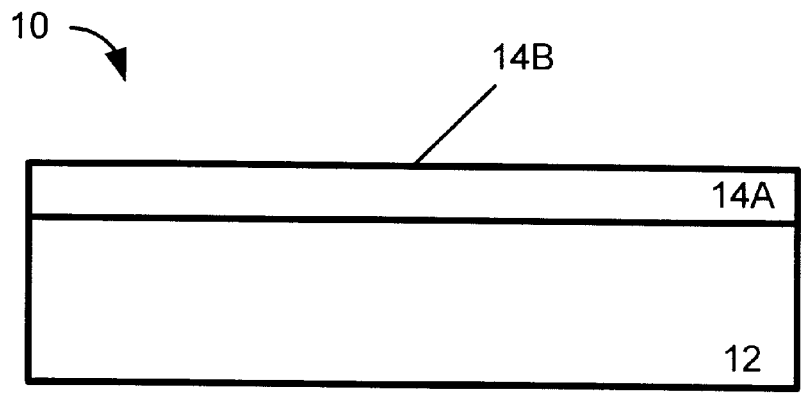
FIG. 1 illustrates a cross-sectional view of a portion of a semiconductor substrate according to one aspect of the present invention.

The present invention involves increasing the surface roughness of the upper surface of a substrate prior to applying an ultra-thin photoresist thereto. The present invention more specifically involves providing an ultra-thin photoresist over a substrate wherein there is strong adhesion between the ultra-thin photoresist and the substrate, thereby improving photolithographic techniques. Even during final spin after application of an ultra-thin photoresist, strong adhesion is maintained between the ultra-thin photoresist and the substrate at all areas of the substrate including the center and outer edges.

The upper surface of the substrate surface over which an ultra-thin photoresist is deposited may contain any layer or device used in semiconductors. Semiconductor layers in this connection include one or more of conductive layers, semiconducting layers, and dielectric layers. Semiconductor devices generally include one or more of active elements and passive elements such as polysilicon gates, word lines, source regions, drain regions, bit lines, bases, emitters, collectors, conductive lines, conductive plugs, etc.

In one embodiment, the upper surface of the substrate is or contains a silicon containing layer. Silicon containing layers include monocrystalline silicon, doped or undoped polysilicon, amorphous silicon, silicon oxide, silicon nitride, silicon oxynitride and silicides. In another embodiment, the upper surface of the substrate is or contains a metal containing layer. Metal containing layers include metal layers, metal alloy layers, metal silicide layers, metal oxide layers, metal nitride layers. Examples of metal containing layers include one or more of aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, and zinc alloys, and suicides, nitrides and oxides thereof. Specific examples of metal containing layers, in addition to the metals and metal alloys listed above, include one or more of tantalum oxide, titanium oxide, titanium silicide, tungsten silicide, and titanium nitride.

In yet another embodiment, the upper surface of the substrate is or contains a dieletric material. In addition to those mentioned above, dielectric materials include low K polymer materials and various oxides. Low K polymer materials include polyimides, fluorinated polyimides, polysilsequioxane, benzocyclobutene (BCB), parlene F, parlene N and amorphous polytetrafluoroethylene. A specific example of a commercially available low K polymer material is Flare™ from AlliedSignal believed to be derived from perfluorobiphenyl and aromatic bisphenols. Oxides include silicon dioxide, fluorine doped silicon glass (FSG), tetraethylorthosilicate (TEOS), phosphosilicate glass (PSG), borophosphosilicate glass (BPSG), and any other suitable spin-on glass, Prior to depositing an ultra-thin photoresist on the substrate, the upper surface of the substrate (the surface adjacent the subsequently deposited ultra-thin photoresist) is roughened to promote adhesion between the substrate and the ultra-thin photoresist. The roughening treatment, however, must not deleteriously effect or damage the substrate. The substrate surface is roughened using either a plasma or an acid solution.

Plasmas that are effective for roughening substrate surfaces include chlorine containing plasmas, fluorine containing plasmas, bromine containing plasmas, oxygen containing plasmas and argon containing plasmas. The plasma may optionally further contain an inert gas. Inert gases include noble gases, hydrogen and nitrogen. Nobles gases include He, Ne, Kr, and Xe. Plasmas include one or more of $Cl_2$, HBr, HCl, Ar, $O_2$, $SF_6$, $NF_3$, $CF_4$, $C_4H_8$, $C_2F_6$ and $CHF_3$. In preferred embodiments, plasmas are employed when the substrate is a metal, metal alloy, oxynitride, nitride, or silicide.

$R_{tm}$ is the mean of the maximum peak-to-valley vertical measurement from each of five consecutive sampling measurements, and can be measured using known techniques including using one of an atomic force microscope and a scanning electron microscope. A rough surface is characterized by a "mountainous" features (numerous peaks and valleys) and/or dendritic features.

In one embodiment, the substrate is contacted with a plasma for a time sufficient to roughen the surface so that the surface has an $r_{tm}$ of about 10 Å or more. Although the time varies primarily depending upon the identity of the substrate and the plasma, the flow rate, the temperature and pressure, in one embodiment, the substrate is contacted with the plasma from about 0.1 second to about 5 minutes. In another embodiment, the substrate is contacted with the plasma from about 1 second to about 2 minutes. In yet another embodiment, the substrate is contacted with the plasma from about 2 seconds to about 30 seconds. In this connection, the time is generally longer for substrates containing upper surfaces of metal compared to substrates containing upper surfaces of a dielectric material.

The substrate is contacted with a flow rate of the plasma sufficient to roughen the surface so that the surface has an $r_{tm}$ of about 10 Å or more. Although the flow rate varies primarily depending upon the identity of the substrate and the plasma, the temperature, the time of contact and the pressure, in one embodiment, the flow rate of the plasma (including all active and/or active and inert components) contacted with the substrate is from about 1 sccm to about 4,000 sccm. In another embodiment, the flow rate of the plasma contacted with the substrate is from about 10 sccm to about 1,000 sccm. In yet another embodiment, the flow rate of the plasma contacted with the substrate is from about 20 sccm to about 500 sccm.

The substrate is contacted with the plasma at a temperature sufficient to roughen the surface so that the surface has an $r_{tm}$ of about 10 Å or more. Although the temperature varies primarily depending upon the identity of the substrate and the plasma, the flow rate, the time of contact and the pressure, in one embodiment, the temperature at which the substrate is contacted with the plasma is from about 10° C. to about 500° C. In another embodiment, the temperature at which the substrate is contacted with the plasma is from about 20° C. to about 250° C. In yet another embodiment, the temperature at which the substrate is contacted with the plasma is from about 25° C. to about 100° C.

The substrate is contacted with the plasma at a pressure sufficient to roughen the surface so that the surface has an $r_{tm}$ of about 10 Å or more. Although the pressure varies primarily depending upon the identity of the substrate and the plasma, the flow rate, the time of contact and the temperature, in one embodiment, the pressure at which the substrate is contacted with the plasma is from about 1 mtorr to about 1,000 torr. In another embodiment, the pressure at which the substrate is contacted with the plasma is from about 5 mtorr to about 800 torr.

Acid solutions that are effective for roughening substrate surfaces include at least one organic acid or inorganic acid. Acid solutions are typically dilute aqueous solutions of one or more of $CH_3CO_2H$, $H_3PO_4$, $HNO_3$, HF, HBr, and HCl, including buffered HF, HBr, and HCl. In one embodiment, the acid solution contains from about 0.001% to about 10% by weight of the acid and the remaining portion water, buffers, and other additives. In another embodiment, the acid solution contains from about 0.01% to about 2% by weight of the acid and the remaining portion water, buffers, and other additives. In yet another embodiment, the acid solution contains from about 0.05% to about 1% by weight of the acid and the remaining portion water, buffers, and other additives. In preferred embodiments, acid solutions are employed when the substrate is an oxide, a low K polymer material or a silicon containing material such as polysilicon.

In another embodiment, the substrate is contacted with an acid solution at a temperature sufficient to roughen the surface so that the surface has an $r_{tm}$ of about 10 Å or more. Although the temperture varies primarily depending upon the identity of the substrate and the acid, in one embodiment, the temperature at which the substrate is contacted with the acid solution (temperature of the acid solution) is from about 10° C. to about 200° C. In another embodiment, the temperature at which the substrate is contacted with the acid solution is from about 20° C. to about 180° C. In yet another embodiment, the temperature at which the substrate is contacted with the acid solution is from about 25° C. to about 60° C.

The substrate is contacted with the acid solution for a time sufficient to roughen the surface so that the surface has an $r_{tm}$ of about 10 Å or more. Although the time varies primarily depending upon the identity of the substrate and the acid, in one embodiment, the substrate is contacted with the acid solution from about 0.1 second to about 5 minutes. In another embodiment, the substrate is contacted with the acid solution from about 1 second to about 2 minutes. In yet another embodiment, the substrate is contacted with the acid solution from about 2 seconds to about 40 seconds.

In one embodiment, a roughened surface (after contact with a plasma or acid solution) refers to a substrate surface having an $r_{tm}$ of about 10 Å or more. In another embodiment, a roughened surface refers to a substrate surface having an $r_{tm}$ of about 25 Å or more. In yet another embodiment, a roughened surface refers to a substrate surface having an $R_{tm}$ of about 50 Å or more. In still yet another embodiment, a roughened surface refers to a substrate surface having an $R_{tm}$ of about 75 Å or more. However, the roughened surface preferably has an $r_{tm}$ of about 200 Å or less since extreme roughening contributes to poor coating uniformity of the ultra-thin photoresist. In another embodiment, the roughened surface has an $r_{tm}$ of about 150 Å or less.

Prior to roughening the semiconductor surface, the $R_{tm}$ of the semiconductor surface is typically less than 10 Å, and more typically less than 5 Å, and even more typically less than 3 Å. In this connection, the $r_{tm}$ of the roughened semiconductor surface is higher than the $R_{tm}$ of the non-roughened semiconductor surface. In one embodiment, the $r_{tm}$ of the roughened semiconductor surface is at least about 5 Å higher than the $R_{tm}$ of the non-roughened semiconductor surface. In another embodiment, the $R_{tm}$ of the roughened semiconductor surface is at least about 10 Å higher than the $r_{tm}$ of the non-roughened semiconductor surface. In yet another embodiment, the $r_{tm}$ of the roughened semiconductor surface is at least about 20 Å higher than the $r_{tm}$ of the non-roughened semiconductor surface.

After the upper semiconductor surface is roughened, an ultra-thin photoresist is deposited over the roughened semiconductor surface by any suitable means. For example, the ultra-thin photoresist is deposited over the roughened semiconductor surface by spin coating. Spin coating typically involves depositing the ultra-thin photoresist on the roughened semiconductor substrate and spinning the coated substrate until the photoresist is dry. Due to the roughened substrate surface, there is strong adhesion between the ultra-thin photoresist and the substrate.

Ultra-thin photoresists in accordance with the present invention have a thickness of about 2,000Å or less. In one embodiment, the ultra-thin photoresist layer has a thickness from about 500 Å to about 2,000 Å. In another embodiment, the ultra-thin photoresist layer has a thickness from about 600 Å to about 1,750 Å (about 1,750 Å or less). In yet another embodiment, the ultra-thin photoresist layer has a thickness from about 750 Å to about 1,500 Å (about 1,500 Å or less).

The ultra-thin photoresist layer has a thickness suitable for functioning as a mask for etching the underlying layer and for forming patterns or openings in the developed ultra-thin photoresist layer that are about 0.1 μm or less, and even about 0.05 μm or less. Since the ultra-thin photoresist layer is relatively thin compared with I-line and other photoresists, improved resolution and critical dimension control is realized.

Ultra-thin resists are processed using small wavelength radiation. As used herein, small wavelength radiation means electromagnetic radiation having a wavelength of about 250 nm or less. In one embodiment, small wavelength radiation includes electromagnetic radiation having a wavelength of about 200 nm or less. In another embodiment, small wavelength radiation includes extreme ultraviolet (UV) electromagnetic radiation having a wavelength of about 25 nm or less. In yet another embodiment, small wavelength radiation includes extreme UV electromagnetic radiation having a wavelength of about 15 nm or less.

Small wavelength radiation increases precision and thus the ability to improve resolution and critical dimension control. Specific examples of wavelengths to which the ultra-thin photoresists are sensitive (undergo chemical transformation enabling subsequent development) include about 248 nm, about 193 nm, about 157 nm, about 13 nm, about 11 nm and about 1 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.5 nm and/or 11.4 nm, and X-rays having a wavelength of about 1 nm.

In embodiments where the patterns or openings formed in the developed ultra-thin photoresist layer are from about 0.1 μm to about 0.15 μm, a 157 nm sensitive photoresist or a 193 nm sensitive photoresist is preferably employed. In embodiments where the patterns or openings formed in the developed ultra-thin photoresist layer are about 0.1 μm or less, a 13 nm sensitive photoresist or an 11 nm sensitive photoresist (extreme UV photoresist) is preferably employed.

Positive or negative ultra-thin photoresists may be employed in the methods of the present invention. An example of a deep UV chemically amplified photoresist is a partially t-butoxycarbonyloxy substituted poly-p-hydroxystyrene. Photoreists are commercially available from a number of sources, including Shipley Company, Kodak, Hoechst Celanese Corporation, and Brewer.

Suitable subsequent processing of the ultra-thin photoresist is conducted including developing the ultra-thin photoresist, semiconductor processing (etching or depositing materials using the patterned ultra-thin photoresist), and stripping the ultra-thin photoresist from the substrate. In many instances, the roughened substrate surface provides the additional advantage that a deposited film, the film deposited during semiconductor processing using the patterned ultra-thin photoresist, adheres more strongly to the substrate surface compared to the same film deposited to an non-roughened substrate surface.

Aspects of the present invention are now discussed in view of the figures. Referring to FIG. 1, a cross-sectional view of a portion of a semiconductor device 10 is illustrated. The method of FIGS. 1–3 may be adapted to any photolithography process including making electrical contacts to various device structures, active elements and passive elements including polysilicon gates, wordlines, source regions, drain regions, bit lines, bases, emitters, collectors, conductive lines, conductive plugs, etc. The method of FIGS. 1–3 may be used with any suitable semiconductor technology including but not limited to NMOS, PMOS, CMOS, BiCMOS, bipolar, multi-chip modules (MCM) and III–IV semiconductors.

Semiconductor device 10 includes semiconductor wafer 12 and semiconductor substrate 14A. Semiconductor wafer 12 may include any suitable semiconductor material, for example, a monocrystalline silicon substrate. Semiconductor substrate 14A also includes any suitable semiconductor material or semiconductor device, for example, one or more of a conductive layer, a semiconducting layer, and a dielectric layer. In this embodiment, semiconductor substrate 14A comprises titanium nitride. Semiconductor substrate 14A has a smooth upper surface 14B. The $r_{tm}$ of the upper surface 14B of semiconductor substrate 14A is about 3 Å.

Figure 2:
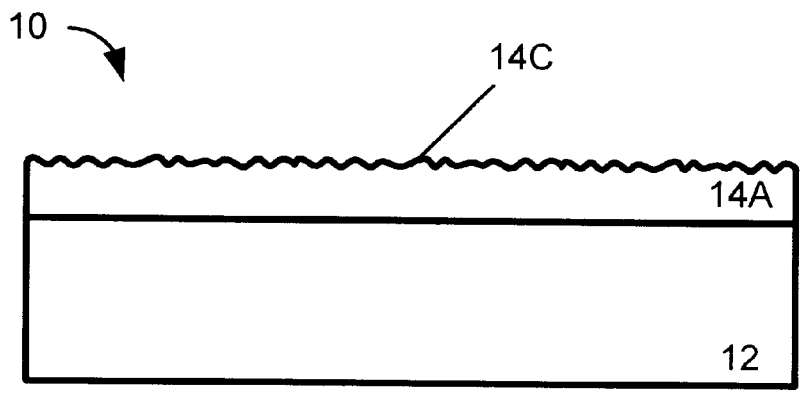
FIG. 2 illustrates a cross-sectional view of a portion of a semiconductor substrate having a roughened surface according to one aspect of the present invention.

Referring to FIG. 2, semiconductor device 10 and in particular the semiconductor substrate 14A is contacted with a plasma. The plasma interacts with the upper surface of the semiconductor substrate 14A and provides a roughened semiconductor surface 14C. Specifically, a mixture of 40 sccm $O_2$ and 40 sccm Ar at 40° C. under 200 torr is contacted with the semiconductor device 10 for 15 seconds. The $r_{tm}$ of the upper surface 14C of semiconductor substrate 14A is about 30 Å.

Figure 3:
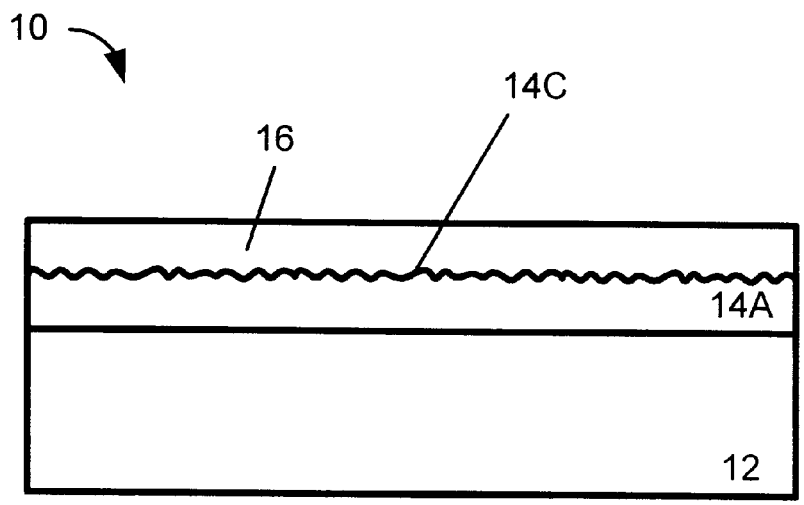
FIG. 3 illustrates a cross-sectional view of a roughened semiconductor substrate having an ultra-thin photoresist thereon according to one aspect of the present invention.

Referring to FIG. 3, an ultra-thin photoresist 16 is deposited using spin coating techniques over the roughened semiconductor surface 14C of the semiconductor substrate 14A. For example, a 13 nm sensitive photoresist is deposited over semiconductor substrate 14A. The ultra-thin photoresist 16 has a thickness of about 1,000 Å (approximately between about 985 Å and about 1,015 Å given the $R_{tm}$ of the roughened semiconductor surface 14C). Strong adhesion between the ultra-thin photoresist 16 and semiconductor substrate 14A is exhibited in all areas of the semiconductor device 10; namely, at portions of the middle of the semiconductor device 10, portions between the middle and edge of the semiconductor device 10, as well as portions near the edge of semiconductor device 10. The semiconductor device 10 including the ultra-thin photoresist 16 over the roughened semiconductor surface 14C is subjected to suitable photolithographic processing steps including photoresist development to provide a patterned ultra-thin photoresist, semiconductor device 10 processing, and photoresist stripping. The strong adhesion is maintained during semiconductor device 10 processing such as etching steps and depositing steps using the patterned ultra-thin photoresist.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor substrate, comprising:
   providing the semiconductor substrate having an upper surface;
   roughening the upper surface of the semiconductor substrate so that the upper surface of the semiconductor substrate has an $r_{tm}$ of from about 10 Å to about 200 Å; and
   depositing an ultra-thin photoresist on the upper surface of the semiconductor substrate, the ultra-thin photoresist having a thickness of from about 500 Å to about 2,000Å.

2. The method of claim 1, wherein the semiconductor substrate comprises one or more of a conductive layer, a semiconducting layer, and a dielectric layer.

3. The method of claim 1, wherein the upper surface of the semiconductor substrate is roughened using a plasma.

4. The method of claim 1, wherein the upper surface of the semiconductor substrate has an $r_{tm}$ of from about 25 Å to about 150Å.

5. The method of claim 1, wherein the ultra-thin photoresist having a thickness of from about 500 Å to about 1,750Å.

6. The method of claim 1 further comprising irradiating the ultra-thin photoresist with electromagnetic radiation having a wavelength of about 200 nm or less.

7. The method of claim 1, wherein the upper surface of the semiconductor substrate has an $r_{tm}$ of about 10 Å to about 75Å.

8. The method of claim 1, wherein the upper surface of the semiconductor substrate has an $r_{tm}$ of about 10 Å to about 50Å.

9. The method of claim 1, wherein the ultra-thin photoresist has a thickness from about 500 Å to about 1,500Å.

10. A method of increasing adhesion between an ultra-thin photoresist and an upper surface of an underlying substrate, comprising:
    contacting a plasma with the upper surface of the underlying substrate so as to roughen the upper surface; and
    depositing the ultra-thin photoresist on the roughened upper surface of the underlying substrate, wherein the ultra-thin photoresist has a thickness of from about 600 Å to about 2,000Å,
    wherein the upper surface has an $r_{tm}$ of from about 10 Å to about 200Å.

11. The method of claim 10, wherein the roughened upper surface of the underlying substrate has an $r_{tm}$ of from about 25 Å to about 150Å.

12. The method of claim 10, wherein the underlying substrate comprises at least one of a metal, a metal alloy, an oxynitride, a nitride, and a silicide.

13. The method of claim 10, wherein the plasma comprises at least one of a chlorine containing plasma, a fluorine containing plasma, a bromine containing plasma, an oxygen containing plasma and an argon containing plasma.

14. The method of claim 10, wherein the plasma comprises at least one of $Cl_2$, HBr, HCl, Ar, $O_2$, $SF_6$, $NF_3$, $CF_4$, $C_4H_8$, $C_2F_6$ and $CHF_3$.

15. The method of claim 10, wherein the plasma is contacted with the upper surface of the underlying substrate at a temperature from about 10° C. to about 500° C. and a pressure from about 1 mtorr to about 1000 torr and for a time from about 0.1 second to about 5 minutes.

16. The method of claim 10 further comprising irradiating the ultra-thin photoresist with electromagnetic radiation having a wavelength of about 25 nm or less.

17. The method of claim 10, wherein the roughened upper surface of the underlying substrate has an $r_{tm}$ of about 10 Å to about 75Å.

18. The method of claim 10, wherein the roughened upper surface of the underlying substrate has an $r_{tm}$ of about 10 Å to about 50Å.

19. The method of claim 10, wherein the ultra-thin photoresist has a thickness from about 500 Å to about 1,500Å.

* * * * *